United States Patent
Chen et al.

(10) Patent No.: US 9,437,701 B2
(45) Date of Patent: Sep. 6, 2016

(54) INTEGRATED CIRCUIT DEVICES WITH COUNTER-DOPED CONDUCTIVE GATES

(71) Applicants: Weize Chen, Phoenix, AZ (US); Richard J. de Souza, Chandler, AZ (US); Md M. Hoque, Gilbert, AZ (US); Patrice M. Parris, Phoenix, AZ (US)

(72) Inventors: Weize Chen, Phoenix, AZ (US); Richard J. de Souza, Chandler, AZ (US); Md M. Hoque, Gilbert, AZ (US); Patrice M. Parris, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/524,172

(22) Filed: Oct. 27, 2014

(65) Prior Publication Data

US 2016/0118469 A1    Apr. 28, 2016

(51) Int. Cl.
| | |
|---|---|
| *H01L 29/78* | (2006.01) |
| *H01L 29/49* | (2006.01) |
| *H01L 29/66* | (2006.01) |
| *H01L 21/28* | (2006.01) |

(52) U.S. Cl.
CPC ..... *H01L 29/4933* (2013.01); *H01L 21/28052* (2013.01); *H01L 29/66477* (2013.01); *H01L 29/78* (2013.01)

(58) Field of Classification Search
CPC ............... H01L 29/78; H01L 21/8232; H01L 21/2255; H01L 21/28105; H01L 27/0811; H01L 29/36; H01L 29/4983; H01L 29/66575; H01L 29/93; H01L 29/94; H01L 21/28052; H01L 29/4933; H01L 29/66477
USPC ........................................................ 257/412
See application file for complete search history.

(56) References Cited

U.S. PATENT DOCUMENTS

| | | | | |
|---|---|---|---|---|
| 4,714,519 | A | * 12/1987 | Pfiester | ............... H01L 21/2255 |
| | | | | 257/336 |
| 5,977,591 | A | * 11/1999 | Fratin | ............... H01L 21/28105 |
| | | | | 257/344 |
| 6,097,070 | A | 8/2000 | Mandelman et al. | |
| 6,630,720 | B1 | 10/2003 | Maszara et al. | |
| 6,867,458 | B2 | 3/2005 | Nikami | |
| 7,315,067 | B2 | 1/2008 | Wang | |
| 2011/0079828 | A1* | 4/2011 | Anderson | ......... H01L 21/28079 |
| | | | | 257/288 |

* cited by examiner

*Primary Examiner* — Duy T Nguyen

(57) ABSTRACT

Integrated circuit devices with counter-doped conductive gates. The devices have a semiconductor substrate that has a substrate surface. The devices also have a first well of a first conductivity type, a source of a second conductivity type, and a drain of the second conductivity type. A channel extends between the source and the drain. A conductive gate extends across the channel. The conductive gate includes a first gate region and a second gate region of the second conductivity type and a third gate region of the first conductivity type. The third gate region extends between the first and second gate regions. The devices further include a gate dielectric that extends between the conductive gate and the substrate and also include a silicide region in electrical communication with the first, second, and third gate regions. The methods include methods of manufacturing the devices.

8 Claims, 5 Drawing Sheets

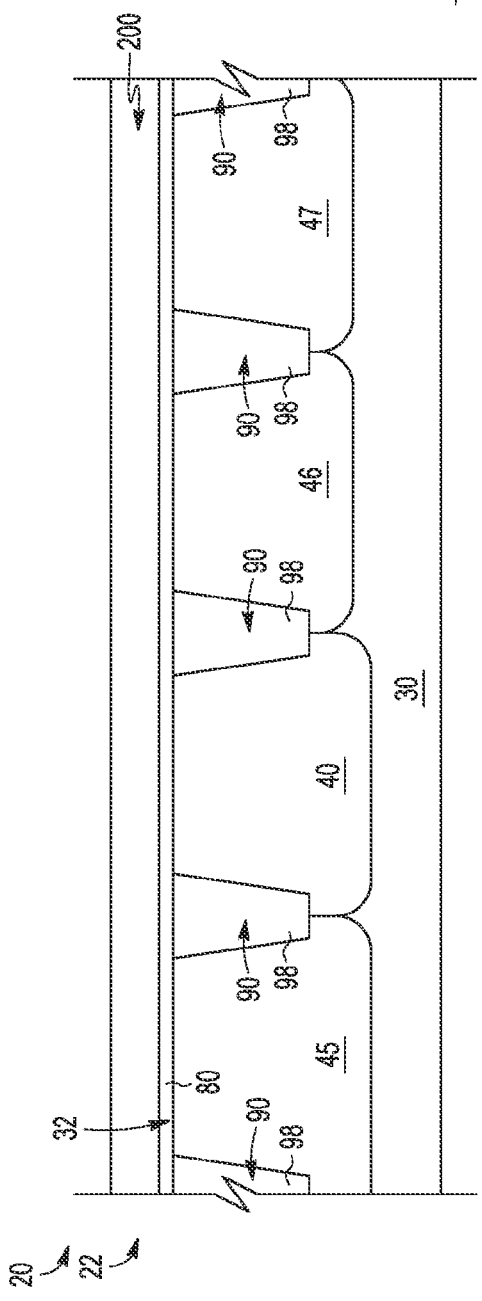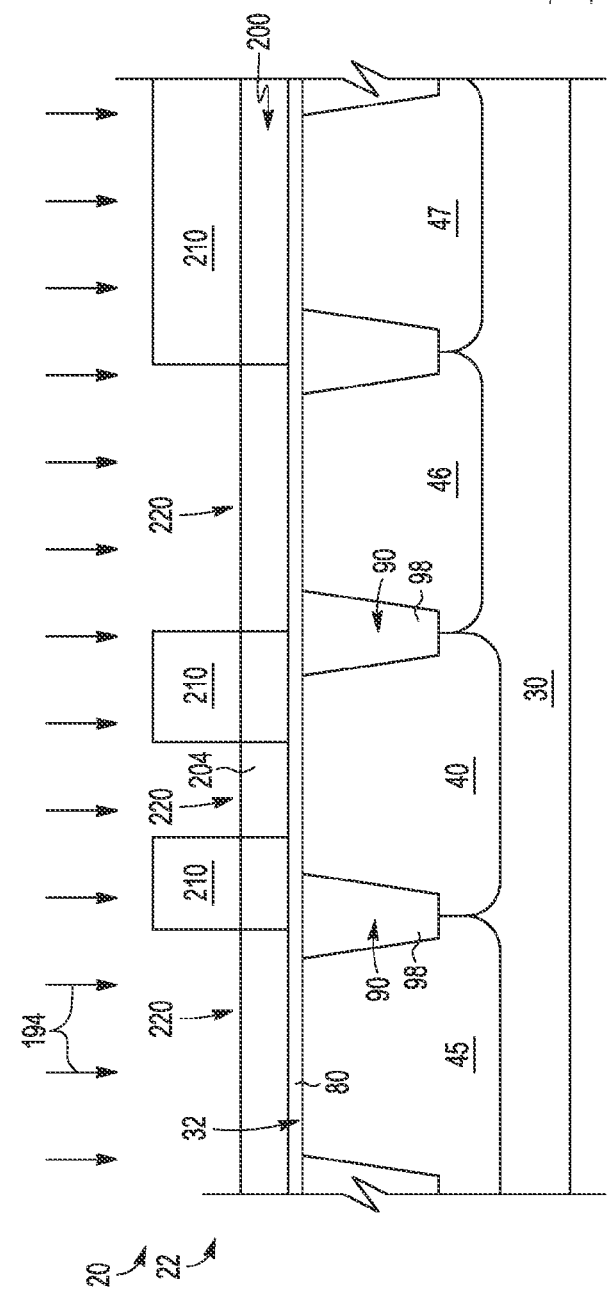

INTEGRATED CIRCUIT DEVICES WITH COUNTER-DOPED CONDUCTIVE GATES

FIELD

This disclosure relates generally to integrated circuit devices, and more specifically, to integrated circuit devices with counter-doped conductive gates.

BACKGROUND

Certain integrated circuit devices, such as devices utilized in integrated non-volatile memory technology, utilize voltages that can be higher than voltages utilized by logic devices or by volatile memory devices. These integrated circuit devices can utilize metal oxide semiconductor (MOS) field effect transistors to switch voltages on the order of 9-14 volts in order to support programming or erase operations of the integrated non-volatile memory. As device dimensions shrink, there is a corresponding decrease in dimensions of the various components of the device. As an example, a gate oxide thickness of the device can be reduced. As another example, a junction depth of the device can be reduced. As yet another example, a drain depth of the device can be reduced.

These changes in device dimensions can produce manufacturing or operational challenges. As an example, gate induced drain leakage (GIDL) can increase between a body of the device and a drain of the device. This increase in GIDL can increase power consumption of the device or heat generation by the device and can be undesirable.

The increase in GIDL can be addressed by a corresponding increase in gate oxide thickness or by utilizing an extended drain. However, each of these approaches increases the area required by the device and can degrade device performance.

BRIEF DESCRIPTION OF THE DRAWINGS

The present invention is illustrated by way of example and is not limited by the accompanying Figures, in which like references indicate similar elements. Elements in the Figures are illustrated for simplicity and clarity and have not necessarily been drawn to scale.

FIG. 2 is a schematic cross-sectional view of an integrated circuit device, according to the present disclosure, during a process flow for manufacture of the integrated circuit device.

FIG. 3 is a schematic cross-sectional view of an integrated circuit device, according to the present disclosure, during a process flow for manufacture of the integrated circuit device.

DETAILED DESCRIPTION

An integrated circuit device according to the present disclosure includes a MOS transistor that includes a three-region conductive gate, which also can be referred to herein as a counter-doped conductive gate. The three-region conductive gate is separated from a well of a first conductivity type by a gate dielectric and includes a first gate region, a second gate region, and a third gate region. The first gate region and the second gate region are of a second conductivity type that is different from the first conductivity type. The third gate region extends between the first gate region and the second gate region and is of the first conductivity type. The three-region structure of the conductive gate increases the polysilicon work function at the center region of the MOS transistor, increasing the threshold voltage of the MOS transistor by up to 1 volt or more. This permits channel doping to be decreased and reduces gate induced drain leakage. The three-region structure of the conductive gate also provides a buffer for penetration of a high voltage, lightly doped drain implant through a poly gate of the integrated circuit device and into a channel of the integrated circuit device during fabrication of the integrated circuit device. The three-region structure of the conductive gate can be fabricated simply by changing a mask for a poly pre-dope implant, as discussed in more detail herein. Thus, the above-described benefits can be achieved without adding new processing steps to the overall integrated circuit device fabrication process.

Figure 1:
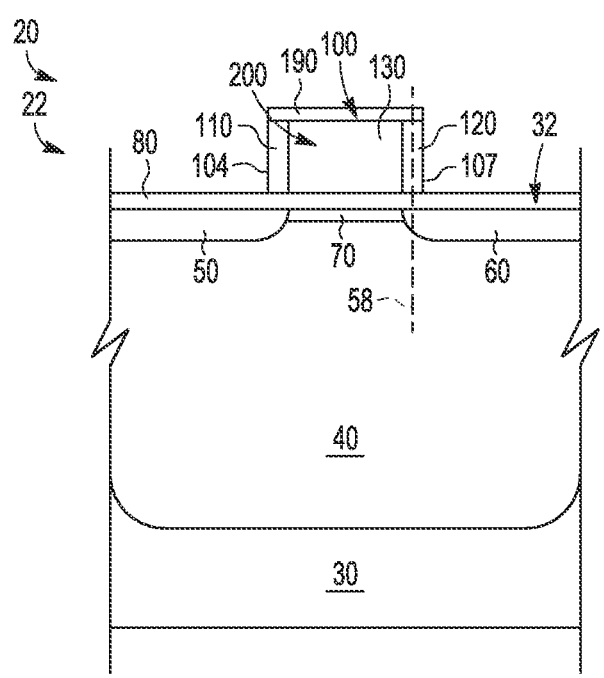
FIG. 1 is a schematic cross-sectional view of an integrated circuit device according to the present disclosure.

FIG. 1 is a schematic cross-sectional view of an integrated circuit device 20 according to the present disclosure. Integrated circuit device 20 of FIG. 1 also can be referred to herein as, or can be, a device 20 or a self-aligned MOS transistor 22. In FIG. 1, device 20 includes a semiconductor substrate 30 that has a substrate surface 32. Device 20 further includes a well 40 that extends within semiconductor substrate 30 or from substrate surface 32. Well 40 has, or is doped to have, a first conductivity type. Device 20 also includes a source 50, which has, or is doped to have, a second conductivity type, and a drain 60, which also has, or is doped to have, the second conductivity type. Source 50 and drain 60 both extend within semiconductor substrate 30 or from substrate surface 32 and are formed, defined, or located within well 40. Device 20 further includes a channel 70, which extends within semiconductor substrate 30 or along substrate surface 32 and is formed, defined, or located within well 40. Channel 70 extends between source 50 and drain 60 or electrically separates source 50 and drain 60. As also illustrated in FIG. 1, device 20 includes a conductive gate 100 that extends across substrate surface 32 and a gate dielectric 80 that extends between conductive gate 100 and substrate surface 32 and that electrically isolates conductive gate 100 from substrate surface 32.

Conductive gate 100 extends along channel 70 and extends between source 50 and drain 60 and includes a first gate region 110, a second gate region 120, and a third gate region 130. First gate region 110 and second gate region 120 have, or are doped to have, the second conductivity type. Third gate region 130 has, or is doped to have, the first conductivity type and extends between (or electrically separates) first gate region 110 and second gate region 120.

As used herein, the phrases "extends between" or "extending between" or the word "between" are intended to indicate that a given structure is located at least partially between a first structure and a second structure. However, the given structure is not required to abut, or contact, the first structure or the second structure. Thus, the phrase "extends between" or the word "between" can be utilized to indicate that the given structure extends entirely between the first structure and the second structure and contacts the first structure and the second structure. Additionally or alternatively, the given structure can be located between the first structure and the second structure but not abut, or contact, the first structure, the second structure, or either of the first structure and the second structure. As an example, channel 70 contacts both source 50 and drain 60 and can be referred to herein as extending between source 50 and drain 60. As another example, conductive gate 100 is separated from source 50 and drain 60 by gate dielectric 80 and can be referred to herein as extending between source 50 and drain 60.

As used herein, the phrases "extends along" or "extending along" are intended to indicate that a first structure extends (at least partially) in parallel with a second structure, that the first structure is (at least partially) coextensive with the second structure, or that the first structure extends (at least partially) in contact with a surface that is defined by the second structure. As an example, conductive gate 100 extends in parallel with channel 70. As another example, conductive gate 100 is at least partially coextensive with channel 70.

First gate region 110, second gate region 120, and third gate region 130 collectively can be referred to herein as gate regions 110/120/130 and can be formed from a gate material 200. The gate material can be a single, or continuous, gate material 200 that extends within gate regions 110/120/130, with gate regions 110/120/130 being formed by doping gate material 200 with different dopants at different dopant concentrations. As such, third gate region 130 is in direct electrical communication with first gate region 110 and also with second gate region 120. Stated another way, first gate region 110 and second gate region 120 are in indirect electrical communication with each other via third gate region 130. An example of gate material 200 is polycrystalline silicon, and gate regions 110/120/130 can be formed from (a single) polycrystalline silicon body that can be formed by a (single) polycrystalline silicon deposition.

Conductive gate 100 can be located, formed, patterned, or fabricated such that a source-proximal edge 104 of first gate region 110 extends above at least a portion of source 50. Similarly, conductive gate 100 also can be located, formed, patterned, or fabricated such that a drain-proximal edge 107 of second gate region 120 extends above at least a portion of drain 60. The conductive gate further can be located, formed, patterned, or fabricated such that third gate region 130 extends across channel 70, extends above channel 70, or extends between source 50 and drain 60.

As used herein, the phrases "extends above" and "located above" can be utilized to indicate that a line that is perpendicular to substrate surface 32 extends through both a first structure and a second structure that "extends above" or is "located above" the first structure along the line. Additionally or alternatively, the phrase "extends below" and "located below" can be utilized to indicate that the line extends through the second structure and the first structure that "extends below" or is "located below" the second structure along the line. As an example, FIG. 1 illustrates dashed line 58 as being perpendicular to substrate surface 32 and extending through drain 60 and second gate region 120. Thus, second gate region 120 extends above or is located above drain 60. Additionally or alternatively, drain 60 extends below or is located below second gate region 120. This arrangement of the location of second gate region 120 relative to drain 60 can permit conductive gate 100 to decrease gate-induced drain leakage between conductive gate 100 and drain 60 when compared to conductive gates that do not include gate regions 110/120/130 according to the present disclosure.

Gate regions 110/120/130 can include respective dopants, which can control, regulate, or dictate the conductivity type or the electrical conductivity of the gate regions. As discussed in more detail herein with reference to FIGS. 2-5, conductive gates 100 can be fabricated by implanting a first dopant of the first conductivity type within third gate region 130 and subsequently implanting a second dopant of the second conductivity type within first gate region 110, second gate region 120, and third gate region 130. As such, a concentration of the first dopant within the third gate region is greater than a concentration of the second dopant within the first gate region, within the second gate region, and within the third gate region, as this concentration difference permits third gate region 130 to maintain the second conductivity type subsequent to being implanted with the second dopant.

In general, the first dopant concentration can be at least 105%, at least 110%, at least 115%, or at least 120% of the second dopant concentration. Specific concentrations for the first dopant and for the second dopant may be selected based upon a desired performance level for device 20 or based upon a desired level of gate induced drain leakage reduction. Additionally or alternatively, the first dopant can be implanted with a dose in the range of 3E15 to 7E15 $cm^{-2}$, while the second dopant can be implanted with a dose in the range of 1E15 to 4E15 $cm^{-2}$. These implant doses can produce first dopant concentrations in the range of 3E20 to 5E20 $cm^{-3}$ and second dopant concentrations in the range of 2E20 to 4E20 $cm^{-3}$.

As further illustrated in FIG. 1, device 20 or conductive gate 100 thereof can include a silicide region 190. Silicide region 190 can be in electrical communication with (or can electrically short) gate regions 110/120/130. In addition, and as illustrated, gate regions 110/120/130 can extend between silicide region 190 and gate dielectric 80. Silicide region 190 can include any suitable combination of silicon from gate regions 110/120/130 with a more electropositive element and can be formed by deposition of the more electropositive element upon gate regions 110/120/130.

The first conductivity type is different from the second conductivity type. The first conductivity type can be n-type (i.e., can utilize electrons as the majority carrier) or p-type (i.e., can utilize holes as the majority carrier). The second conductivity type is the opposite of the first conductivity type. Thus, when the first conductivity type is n-type, the second conductivity type is p-type. Conversely, when the first conductivity type is p-type, the second conductivity type is n-type. An n-type region can be formed through incorporation of an n-type dopant into a semiconducting material (such as a region of semiconductor substrate 30 or a region of gate material 200). Similarly, a p-type region can be formed through incorporation of a p-type dopant into the semiconducting material.

Semiconductor substrate 30 can include, or be, any suitable semiconducting material. As examples, semiconductor substrate 30 can include silicon, silicon germanium, gallium arsenic, gallium arsenide, a Group IV semiconducting material, or a Group III-V semiconducting material. During processing or formation of integrated circuit device 20, semiconductor substrate 30 can form a portion of, or be, a wafer or a semiconductor wafer. The semiconducting material can be a bulk semiconducting material that forms a portion (or even all) of semiconductor substrate 30, an epitaxial layer that forms a portion of the semiconductor substrate, or a silicon on insulator substrate.

Well 40 also can be referred to herein as well region 40 and can include any suitable portion, or region, of semiconductor substrate 30 that can be doped or otherwise constructed to have the first conductivity type. As an example, well 40 can include a portion, or region, of semiconductor substrate 30 that has been implanted with a dopant of the first conductivity type and subsequently annealed. As another example, well 40 can include a portion, or region, of semiconductor substrate 30 into which the dopant of the first conductivity type has been diffused or otherwise located.

Source 50 and drain 60 also can be referred to herein as source region 50 and drain region 60, respectively, and can include any suitable portions, or regions, of well 40 that have been doped or otherwise constructed to have the second conductivity type. As an example, source 50 and drain 60 can include portions, or regions, of well 40 that have been implanted with a dopant of the second conductivity type and subsequently annealed. Source 50 and drain 60 can include both the dopant of the first conductivity type (such as can be present therein due to formation of well 40) and the dopant of the second conductivity type. However, a concentration of the dopant of the second conductivity type within source 50 and drain 60 can be greater than a concentration of the dopant of the first conductivity type, thereby causing source 50 and drain 60 to have the second conductivity type.

Channel 70 also can be referred to herein as channel region 70 and can include a portion, or region, of well 40 that extends along substrate surface 32, that extends directly below at least a portion of conductive gate 100, or that extends between source 50 and drain 60. Channel 70 can have the first conductivity type or can be doped to a same concentration (or concentration profile) as a remainder of well 40 utilizing the same dopant as the remainder of well 40. Additionally or alternatively, channel 70 can include a different dopant or have a different dopant concentration than the remainder of well 40. As an example, a portion of a dopant that is utilized to dope conductive gate 100 can penetrate conductive gate 100 and gate dielectric 80 and thereby can be incorporated into channel 70.

Gate dielectric 80 can include any suitable dielectric, or electrically insulating, material that can be located, or present, on substrate surface 32, can be grown from substrate surface 32, or can extend between substrate surface 32 and conductive gate 100. As examples, gate dielectric 80 can include, or be, a thermally grown oxide, such as a thermally grown silicon oxide, a deposited oxide, such as a deposited silicon oxide, or another electrically insulating material that is not required to include silicon or oxygen.

Regardless of the exact composition of gate dielectric 80, the gate dielectric can be formed from a single, continuous, or (nominally) constant-thickness layer of dielectric material that extends between substrate surface 32 and an entirety of conductive gate 100, including first gate region 110, second gate region 120, and third gate region 130. As such, a thickness (or average thickness) of gate dielectric 80 that extends below first gate region 110, second gate region 120, and third gate region 130 can be (nominally) the same. Additionally or alternatively, the same processing steps can be utilized to form all of gate dielectric 80, including portions of gate dielectric 80 that extend between substrate surface 32 and first gate region 110, second gate region 120, and third gate region 130.

FIGS. 2-5 are schematic cross-sectional views of steps in a process flow for forming an integrated circuit device 20 according to the present disclosure. The integrated circuit device of FIGS. 2-5 can be a self-aligned MOS transistor 22 that can be similar (or even identical) to device 20 of FIG. 1. As such, any of the structures or features of device 20 of FIGS. 2-5 can be included in or utilized with device 20 of FIG. 1. Similarly, any of the structures or features of device 20 of FIG. 1 can be included in or utilized with device 20 of FIGS. 2-5. In addition, any of the process steps of FIGS. 2-5 can be utilized to fabricate device 20 of FIG. 1. Similarly, any of the process steps that were discussed herein with reference to FIG. 1 can be utilized in (or in conjunction with) the process flow of FIGS. 2-5.

In FIGS. 2-5, device 20 includes a semiconductor substrate 30 that includes a substrate surface 32. A gate dielectric 80 extends across substrate surface 32. Device 20 further includes a well 40 of a first conductivity type and also can include a plurality of additional wells 45, 46, and 47. A plurality of trench regions 90, each including a respective trench dielectric 98, can extend (at least partially) between adjacent wells 40, 45, 46, and 47. Additionally or alternatively, trench regions 90 can extend from substrate surface 32 and around wells 40, 45, 46, or 47 to form at least a portion of a boundary of wells 40, 45, 46, or 47. Trench dielectric 98 can include any suitable electrically insulating material, examples of which are disclosed herein with reference to gate dielectric 80.

Adjacent wells can alternate in conductivity type. As such, wells 45 and 46 can be of a second conductivity type, and well 47 can be of the first conductivity type. The wells also can vary in intended function or use. For example, wells 40 and 45 can be (relatively) higher voltage wells (such as wells that are designed to include transistors that switch voltages on the order of 9-14 volts), while wells 46 and 47 can be (relatively) lower voltage wells (such as wells that are designed to include transistors that switch voltages on the order of 1-5 volts). As illustrated, the higher voltage wells can extend deeper into semiconductor substrate 30 (or farther from substrate surface 32) than the lower voltage wells.

As illustrated in FIG. 2, a gate material 200 initially can extend across substrate surface 32, with gate dielectric 80 extending between (or electrically separating) substrate surface 32 and gate material 200. Subsequently, and as illustrated in FIG. 3, a photoresist 210 can be located upon gate material 200 and patterned to expose several exposed regions 220 of gate material 200. Then, an implant step can be utilized to implant a dopant 194 of the first conductivity type into exposed regions 220 of gate material 200, thereby causing exposed regions 220 to have the first conductivity type. After the implant step, photoresist 210 that is illustrated in FIG. 3 can be removed from device 20, and device 20 can be annealed.

In traditional process flows for forming traditional integrated circuit devices, this implant step would be utilized to dope portions of gate material 200 that subsequently will be utilized to form conductive gates for integrated circuit devices that include wells 45 and 46 of the second conductivity type. In these traditional process flows, exposed regions 220 include a majority (or even all) of a portion of gate material 200 that extends above wells 45 and 46. However, in these traditional process flows, portions of gate material 200 that extend above wells 40 and 47 of the first conductivity type generally would not include exposed regions 220 or would be protected from dopant 194 by photoresist 210.

In contrast, in integrated circuit devices 20 disclosed herein, exposed regions 220 also include a portion 204 of gate material 200 that extends above well 40. Thus, dopant 194 can be incorporated into portion 204, thereby causing portion 204 to be doped to the first conductivity type. As discussed in more detail herein, portion 204 subsequently will be utilized to form third gate region 130 of conductive gate 100 (as illustrated in FIGS. 1 and 5).

A benefit of the process flow of FIGS. 2-5 is that portion 204 can be doped to the first conductivity type with dopant 194 during doping of the regions of gate material 200 that extend above wells 45 and 46 and without performing any additional process steps. Thus, conductive gate 100 of FIGS. 1 and 5 can be fabricated without increasing the number of process steps utilized to fabricate device 20 or without increasing a complexity of the manufacturing process of device 20.

Figure 4:
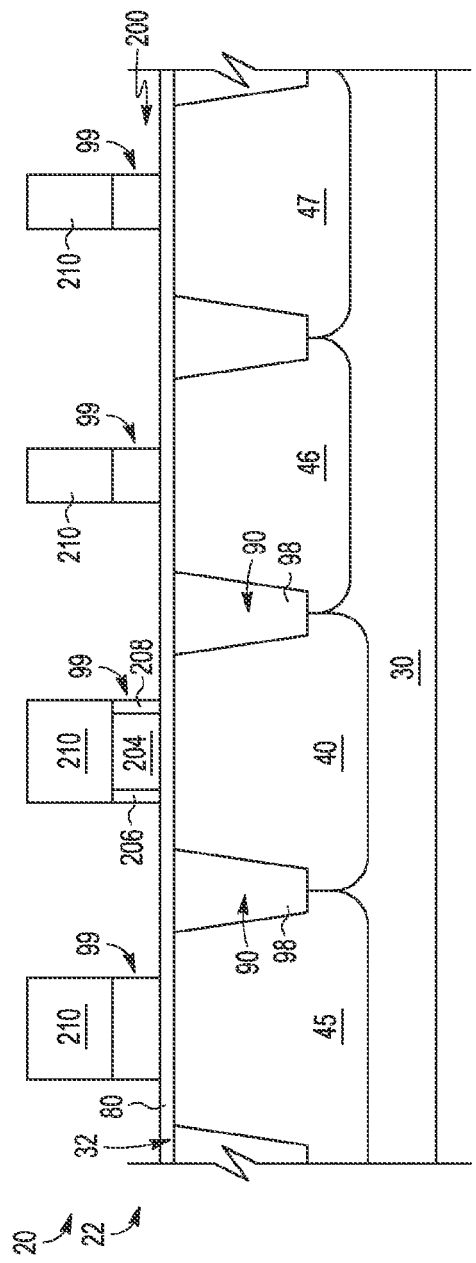
FIG. 4 is a schematic cross-sectional view of an integrated circuit device, according to the present disclosure, during a process flow for manufacture of the integrated circuit device.

As illustrated in FIG. 4, additional photoresist 210 then can be located above portions of gate material 200 that will be utilized to form gates 99 of device 20. A remainder of gate material 200 then can be removed from device 20, such as by etching, to form gates 99. As further illustrated in FIG. 4, photoresist 210 can be sized or patterned such that gate 99, which is associated with well 40, includes portion 204 and also includes a first undoped region 206 and a second undoped region 208. Undoped regions 206 and 208 can be formed from a portion of gate material 200 that was not doped with first dopant 194 during the implant steps of FIG. 3, and portion 204 can extend between first undoped region 206 and second undoped region 208.

Figure 5:
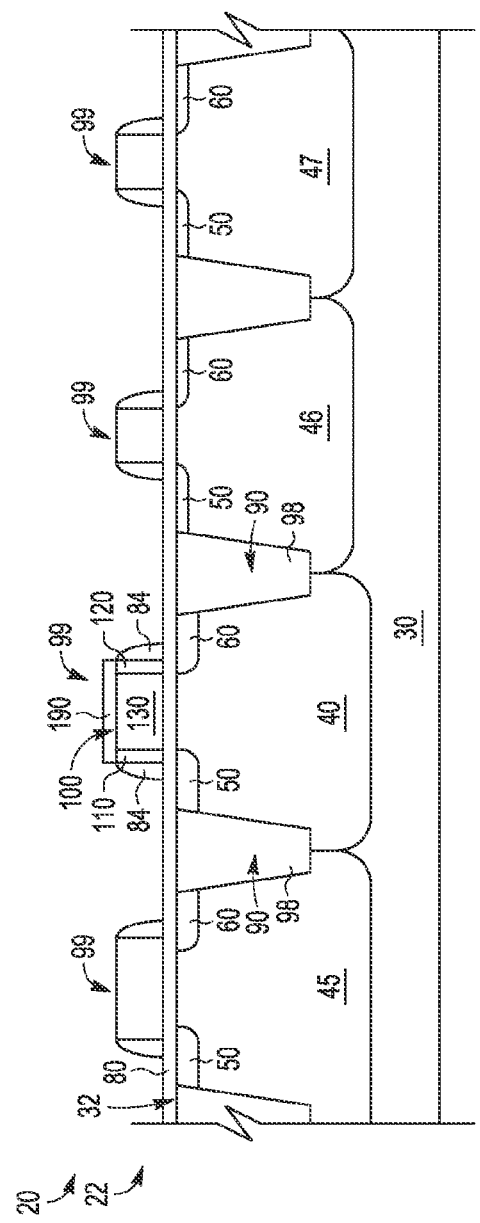
FIG. 5 is a schematic cross-sectional view of an integrated circuit device, according to the present disclosure, during a process flow for manufacture of the integrated circuit device.

As illustrated in FIG. 5, additional implant steps can be utilized in conjunction with selective photoresist patterning to implant dopants into gates 99 and also into wells 40, 45, 46, and 47. The implant into wells 40, 45, 46, and 47 can be self-aligned implant steps that can form respective sources 50 and drains 60 within the wells. Sources 50 and drains 60 associated with wells 45 and 46 (which are of the second conductivity type) can be implanted with a dopant of the first conductivity type such that these sources and drains are of the first conductivity type. Conversely, sources 50 and drains 60 associated with wells 40 and 47 (which are of the first conductivity type) can be implanted with a dopant of the second conductivity type such that these sources and drains are of the second conductivity type.

During doping of source 50 and drain 60 that are associated with well 40, gate 99 that is associated with well 40 also can be exposed to the dopant of the second conductivity type. This causes undoped regions 206 and 208 (of FIG. 4) to be doped to the second conductivity type, thereby forming conductive gate 100 according to the present disclosure that includes first gate region 110 of the second conductivity type, second gate region 120 of the second conductivity type, and third gate region 130 of the first conductivity type.

As illustrated in FIG. 5, device 20 can include sidewall spacers 84. Sidewall spacers 84 can be utilized to regulate the implant into sources 50 and drains 60, thereby regulating an extent to which sources 50 and drains 60 diffuse beneath gates 99 or permitting control or regulation of a horizontal concentration profile of dopant within sources 50 and drains 60. For example, a first source/drain implant can be performed within a respective well prior to formation of sidewall spacers 84, and a second source/drain implant can be performed within the respective well subsequent to formation of sidewall spacers 84. Subsequent to formation of conductive gate 100, a silicide region 190 can be formed thereon.

Figure 6:
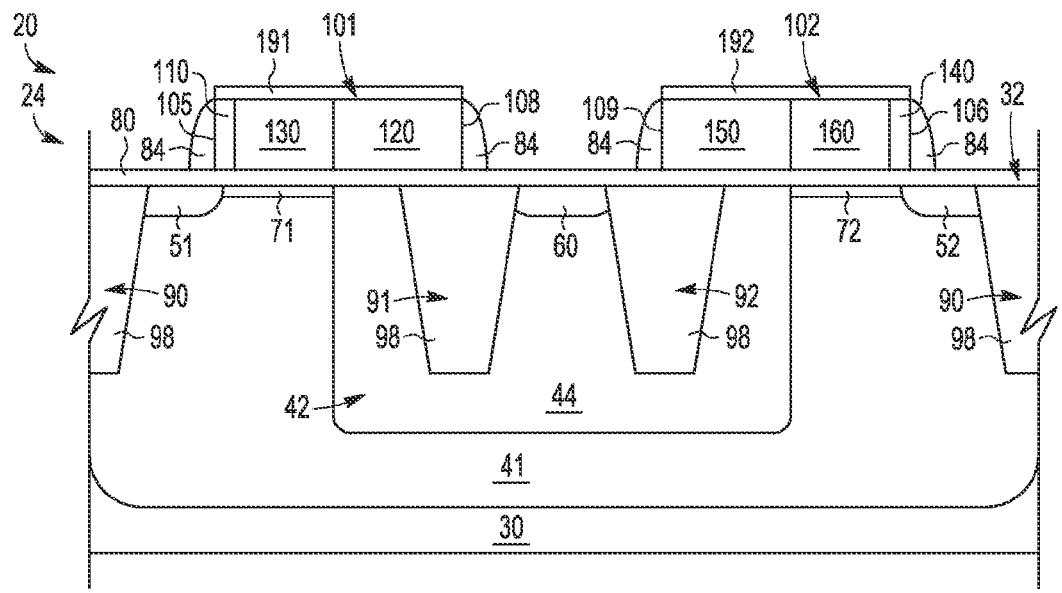
FIG. 6 is a schematic cross-sectional view of an integrated circuit device according to the present disclosure.
Figure 7:
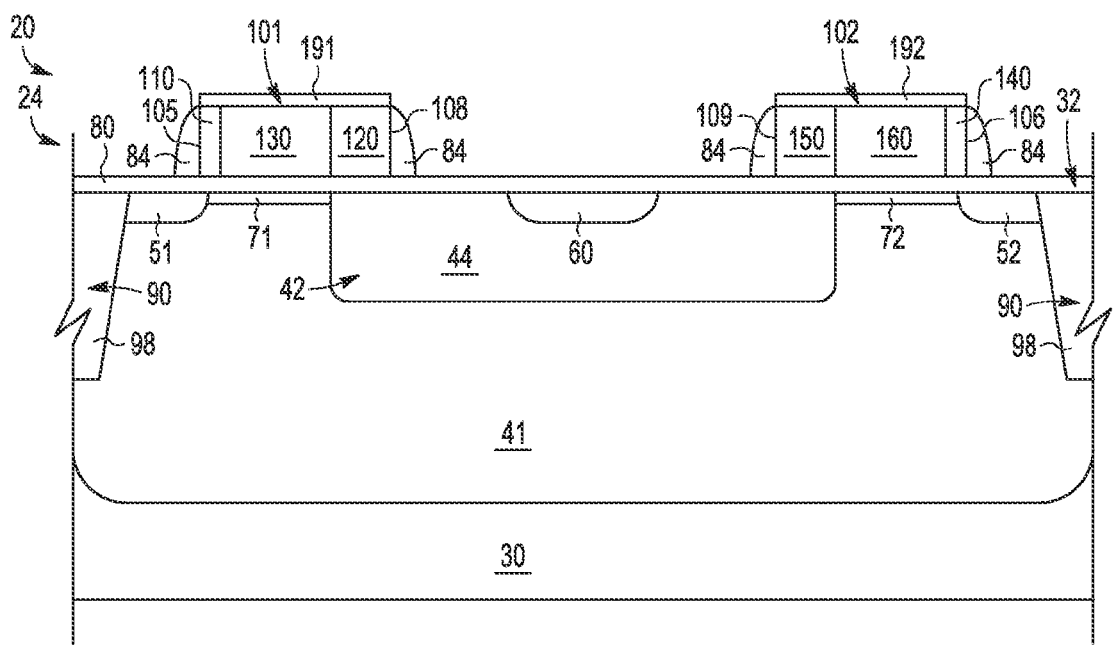
FIG. 7 is a schematic cross-sectional view of an integrated circuit device according to the present disclosure.

FIGS. 6-7 are schematic cross-sectional views of other integrated circuit devices 20 according to the present disclosure. Devices 20 of FIGS. 6-7 include laterally diffused MOS transistors 24. In FIGS. 6-7, integrated circuit devices 20 include a semiconductor substrate 30 having a substrate surface 32. Devices 20 further include a first well 41 of a first conductivity type that extends within semiconductor substrate 30 or from substrate surface 32. Devices 20 also include a second well 42 of a second conductivity type. As illustrated in FIGS. 6-7, second well 42 can be formed, or can extend, within first well 41 or from substrate surface 32 to form a drain drift region 44 of device 20. Alternatively, second well 42 also can abut at least a portion of first well 41, can extend adjacent at least a portion of first well 41, or can extend adjacent a first channel 71 of integrated circuit device 20. A first source 51 of the second conductivity type is formed within first well 41 or extends from substrate surface 32, and a second source 52 of the second conductivity type also is formed within first well 41 or extends from substrate surface 32. Second well 42 extends between first source 51 and second source 52.

As further illustrated in FIGS. 6-7, first channel 71, which is formed within first well 41, extends along substrate surface 32. The first channel extends between and electrically separates first source 51 and second well 42. Similarly, a second channel 72, which is formed within first well 41, extends along substrate surface 32. The second channel extends between and electrically separates second source 52 and second well 42. A drain 60 of the second conductivity type extends from substrate surface 32. Drain 60 is formed, is defined, or extends, within second well 42.

A first conductive gate 101 extends across substrate surface 32 and along first channel 71. The first conductive gate extends between first source 51 and second well 42. The first conductive gate includes a first gate region 110 of the second conductivity type, a second gate region 120 of the second conductivity type, and a third gate region 130 of the first conductivity type. The third gate region extends between the first gate region and the second gate region. A first silicide region 191 can extend in electrical communication with first gate region 110, second gate region 120, and third gate region 130. The first gate region 110, the second gate region 120, and the third gate region 130 are located between the first silicide region 191 and substrate surface 32.

A second conductive gate 102 extends across substrate surface 32 and along second channel 72. The second conductive gate extends between second source 52 and second well 42. The second conductive gate includes a fourth gate region 140 of the second conductivity type, a fifth gate region 150 of the second conductivity type, and a sixth gate region 160 of the first conductivity type. The sixth gate region extends between the fourth gate region and the fifth gate region. A second silicide region 192 can extend in electrical communication with fourth gate region 140, fifth gate region 150, and sixth gate region 160. The fourth gate region 140, the fifth gate region 150, and the sixth gate region 160 are located between the second silicide region 192 and substrate surface 32.

A gate dielectric 80 extends between substrate surface 32 and first conductive gate 101 and also between substrate surface 32 and second conductive gate 102. The gate dielectric electrically isolates the substrate surface from the first conductive gate and from the second conductive gate. Sidewall spacers 84 can extend along the sides of first conductive gate 101 or second conductive gate 102.

First gate region 110, second gate region 120, and third gate region 130 can be formed from a first polycrystalline silicon body, and third gate region 130 can be in (direct) electrical contact with first gate region 110 and with second gate region 120. In addition, first gate region 110, second gate region 120, and third gate region 130 can extend between first silicide region 191 and gate dielectric 80. Similarly, fourth gate region 140, fifth gate region 150, and sixth gate region 160 can be formed from a second polycrystalline silicon body, and sixth gate region 160 can be in (direct) electrical contact with fourth gate region 140 and with fifth gate region 150. In addition, fourth gate region 140, fifth gate region 150, and sixth gate region 160 can extend between second silicide region 192 and gate dielectric 80.

First gate region 110 can form a first source-proximal edge 105 of first conductive gate 101 and can extend above at least a portion of first source 51. Second gate region 120 can form a drain drift region-proximal edge 108 of first conductive gate 101 and can extend above at least a portion of second well 42. Third gate region 130 can extend across first channel 71 and between first source 51 and second well 42.

Similarly, fourth gate region 140 can form a second source-proximal edge 106 of second conductive gate 102 and can extend above at least a portion of second source 52. Fifth gate region 150 can form a drain drift region-proximal edge 109 of second conductive gate 102 and can extend above at least a portion of second well 42. Sixth gate region 160 can extend across second channel 72 and between second source 52 and second well 42.

As illustrated in FIGS. 6-7, devices 20 further can include trench regions 90. Trench regions 90 can extend from substrate surface 32, can extend around first well 41 and second well 42, or can form a portion of a boundary of first well 41. As illustrated in FIG. 6, devices 20 also can include a first trench region 91 and a second trench region 92. First trench region 91 can extend from substrate surface 32 within second well 42 and between drain region 60 and first channel 71. Second trench region 92 can extend from substrate surface 32 within second well 42 and between drain region 60 and second channel 72. Trench region 90, first trench region 91, and second trench region 92 include a trench dielectric 98. Examples of trench dielectric 98 are disclosed herein.

Devices 20 of FIGS. 6-7 are structurally distinct from devices 20 of FIGS. 1-5. However, several of the structures of devices 20 of FIGS. 6-7 can be formed in a manner that is consistent with formation of corresponding structures in FIGS. 1-5 or can include compositions that are similar to corresponding structures in FIGS. 1-5. As an example, first well 41 of FIGS. 6-7 can be formed in a manner that is similar to, or can include a similar composition to, well 40 of FIGS. 1-5. As another example, first source 51 and second source 52 of FIGS. 6-7 can be formed in a manner that is similar to, or can include a composition that is similar to, source 50 of FIGS. 1 and 5. As yet another example, drain 60 of FIGS. 6-7 can be formed in a manner that is similar to, or can include a composition that is similar to, drain 60 of FIGS. 1 and 5. As another example, first channel 71 and second channel 72 of FIGS. 6-7 can be formed in a manner that is similar to, or can include a composition that is similar to, channel 70 of FIG. 1. As yet another example, gate dielectric 80 can be formed in a manner that is similar to, or can include a composition that is similar to, gate dielectric 80 of FIGS. 1-5. As another example, trench region 90, first trench region 91, second trench region 92, or trench dielectric 98 of FIGS. 6-7 can be formed in a manner that is similar to, or can include a composition that is similar to, trench region 90 or trench dielectric 98 of FIG. 5. As yet another example, the first conductivity type can be n-type or p-type, with the second conductivity type being the opposite of the first conductivity type, as discussed herein with reference to FIG. 1.

As another example, first conductive gate 101 and second conductive gate 102 of FIGS. 6-7 can be formed in a manner that is similar to, or can include a composition that is similar to, conductive gate 100 of FIGS. 1 and 5. As a more specific example, third gate region 130 and sixth gate region 160 of FIGS. 6-7 can include a first dopant of the first conductivity type. In addition, first gate region 110, second gate region 120, fourth gate region 140, and fifth gate region 150 of FIGS. 6-7 can include a second dopant of the second conductivity type. The concentration of the first dopant within the third gate region and the sixth gate region can be greater than the concentration of the second dopant in the first gate region, the second gate region, the fourth gate region, and the fifth gate region. Examples of relationships between the first dopant concentration and the second dopant concentration, examples of first dopant concentration and second dopant concentration, and examples of benefits of the disclosed dopant concentrations are disclosed herein with reference to FIG. 1.

Figure 8:
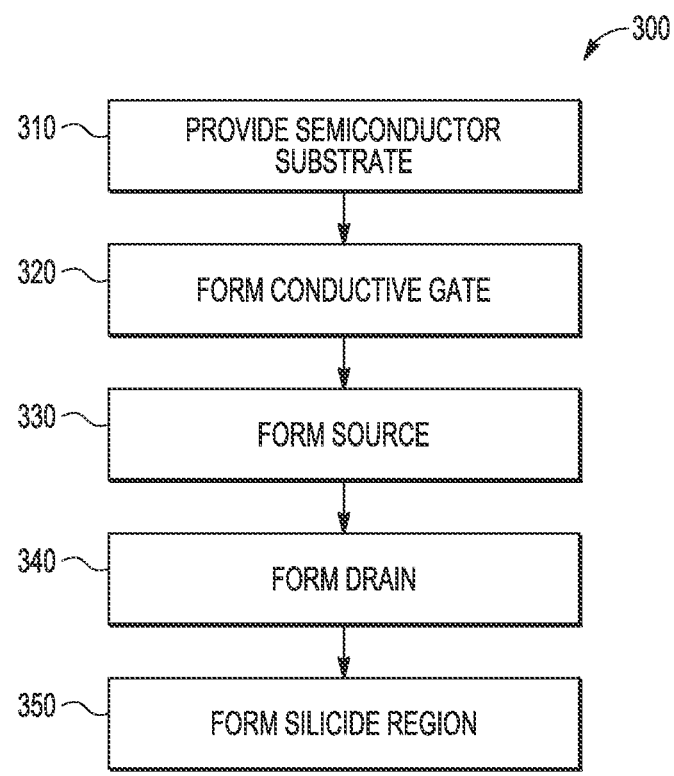
FIG. 8 is a flowchart depicting methods of manufacturing an integrated circuit device according to the present disclosure.

FIG. 8 is a flowchart depicting methods 300 of manufacturing an integrated circuit device according to the present disclosure. Methods 300 can form a portion of the process flow of FIGS. 2-5 and can include providing a semiconductor substrate at 310, forming a conductive gate at 320, or forming a source at 330. Methods 300 further can include forming a drain at 340 or forming a silicide region at 350.

Providing the semiconductor substrate at 310 can include providing any suitable semiconductor substrate that has a substrate surface. The semiconductor substrate can include a well of a first conductivity type that extends from the substrate surface and a gate material that extends across the substrate surface. The semiconductor substrate further can include a gate dielectric. The gate dielectric can extend between the gate material and the substrate surface. The gate dielectric also can electrically isolate the gate material from the substrate surface. The semiconductor substrate also can include an isolation structure, such as a trench region, that can be filled with a trench dielectric or that can extend around the well of the first conductivity type. The providing at 310 further can include forming the well, forming the gate material, forming the gate dielectric, or forming the isolation structure. When the providing at 310 includes forming the gate dielectric, the gate dielectric can be formed from a single, continuous layer of dielectric material that extends from the substrate surface.

Forming the conductive gate at 320 can include forming such that the conductive gate extends above the well. The forming at 320 further can include forming a first gate region of a second conductivity type that is different from the first conductivity type and forming a second gate region of the second conductivity type. The forming at 320 also can include forming a third gate region of the first conductivity type such that the third gate region extends between the first gate region and the second gate region.

The forming at 320 can be accomplished in any suitable manner. As an example, the forming at 320 can include doping a central portion of a polycrystalline silicon body with a first dopant of the first conductivity type at a first dopant concentration to form the third gate region. The first dopant can be applied via an implant process. The forming at 320 also can include doping the (entire) polycrystalline body with a second dopant of the second conductivity type at a second dopant concentration to form the first gate region and the third gate region. The second dopant also can be applied via an implant process. The second dopant concentration can be less than the first dopant concentration so that the third gate region remains of the first conductivity type subsequent to doping the polycrystalline body with the second dopant.

Forming the source at 330 can include forming the source of the second conductivity type within the well. The forming at 330 can include forming such that the source extends from the substrate surface and adjacent the first gate region. The forming at 330 also can include forming such that the first gate region extends above at least a portion of the source or forming a self-aligned source utilizing the conductive gate as a mask for an implant process that is utilized to form the source. The forming at 330 can include performing an implant process to implant a dopant of the second conductivity type into the well.

Forming the drain at 340 can include forming the drain of the second conductivity type within the well. The forming at 340 can include forming such that the drain extends from the substrate surface and adjacent the second gate region. The forming at 340 also can include forming such that the second gate region extends above at least a portion of the drain or forming a self-aligned drain utilizing the conductive gate as a mask for an implant process that is utilized to form the drain. The forming at 340 can include performing an implant process to implant a dopant of the second conductivity type into the well. The forming at 340 can be performed concurrently with the forming at 330. The forming at 340 also can be performed concurrently with the doping the entire polycrystalline body, which can form a portion of the forming at 320.

Forming the silicide region at 350 can include forming such that the silicide region is in electrical communication with the first gate region, with the second gate region, and with the third gate region. The forming at 350 can be accomplished in any suitable manner. As an example, the forming at 350 can include depositing a material that is more electropositive than the conductive gate on the conductive gate.

Although the invention is described herein with reference to specific embodiments, various modifications and changes can be made without departing from the scope of the present invention as set forth in the claims below. For example, integrated circuit device 20 can include other structures in addition to the self-aligned MOS transistors and the laterally diffused MOS transistors that are illustrated and discussed herein. As another example, integrated circuit devices 20 of FIGS. 1 and 5 are illustrated as including a single gate that regulates electric current flow between a single source and a single drain; however, embodiments that include two or more gates that regulate electric current flow between respective sources and drains are also within the scope of embodiments of the present invention. Under these conditions, conductive gate 100 of FIGS. 1 and 5 also may be referred to herein as a first conductive gate 100. Similarly, integrated circuit devices 20 of FIGS. 6-7 are illustrated as including a double gate structure in which a first conductive gate 101 and a second conductive gate 102 regulate electric current flow between two sources and a single drain; however, embodiments that include a single gate or more than two gates are also within the scope of embodiments of the present invention. When integrated circuit devices 20 of FIGS. 6-7 include a single gate, first conductive gate 101 also may be referred to herein as a conductive gate 101, first source 51 also may be referred to herein as a source 51, first channel 71 also may be referred to herein as a channel 71, first trench region 91 also may be referred to herein as a channel region 91, or first silicide region 191 also may be referred to herein as a silicide region 191. Accordingly, the specification and Figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any of the claims.

Unless stated otherwise, terms such as "first" and "second" are used to arbitrarily distinguish between the elements such terms describe. Thus, these terms are not necessarily intended to indicate temporal or other prioritization of such elements.

As used herein the terms "adapted" and "configured" mean that the element, component, or other subject matter is designed, or intended, to perform a given function. Thus, the use of the terms "adapted" and "configured" should not be construed to mean that a given element, component, or other subject matter is simply "capable of" performing a given function but that the element, component, or other subject matter is specifically selected, created, implemented, utilized, programmed, or designed for the purpose of performing the function. It is also within the scope of embodiments of the present invention that elements, components, or other recited subject matter that is recited as being adapted to perform a particular function may additionally or alternatively be described as being configured to perform that function, and vice versa.

As used herein, the term "or" should be interpreted as being inclusive or exclusive. For example, "A or B" can be interpreted to mean A, B, or both A and B.

As used herein, the phrase, "for example," the phrase, "as an example," and/or simply the term "example," when used with reference to one or more components, features, details, structures, embodiments, and/or methods according to the present disclosure, are intended to convey that the described component, feature, detail, structure, embodiment, and/or method is an illustrative, non-exclusive example of components, features, details, structures, embodiments, and/or methods according to the present disclosure. Thus, the described component, feature, detail, structure, embodiment, and/or method is not intended to be limiting, required, or exclusive/exhaustive; and other components, features, details, structures, embodiments, and/or methods, including structurally and/or functionally similar and/or equivalent components, features, details, structures, embodiments, and/ or methods, are also within the scope of embodiments of the present invention.

The following are various embodiments of the present invention.

In a first embodiment, there is provided an integrated circuit device. The integrated circuit device includes a semiconductor substrate having a substrate surface. The integrated circuit device includes a well of a first conductivity type. The well extends from the substrate surface. The integrated circuit device includes a source of a second conductivity type. The second conductivity type is different from the first conductivity type. The source is formed within the well and extends from the substrate surface. The integrated circuit device includes a drain of the second conductivity type. The drain is formed within the well and extends from the substrate surface. The integrated circuit device includes a channel. The channel is formed within the well. The channel extends along the substrate surface and electrically separates the source and the drain. The integrated circuit device includes a conductive gate. The conductive gate extends across the substrate surface and along the channel between the source and the drain. The conductive gate includes a first gate region of the second conductivity type, a second gate region of the second conductivity type, and a third gate region of the first conductivity type. The third gate region extends between the first gate region and the second gate region. The conductive gate includes a gate dielectric. The gate dielectric extends between and electrically isolates the conductive gate and the substrate surface. The conductive gate includes a silicide region. The silicide region is in electrical communication with the first gate region, the second gate region, and the third gate region. The first gate region, the second gate region, the third gate region, and the silicide region can be formed from a polycrystalline silicon body. The first gate region, the second gate region, and the third gate region can extend between the silicide region and the gate dielectric. The third gate region can be in direct electrical contact with the first gate region and with the second gate region. The first gate region can form a source-proximal edge of the conductive gate. The source-proximal edge extends above at least a portion of the source. The second gate region can form a drain-proximal edge of the conductive gate. The drain-proximal edge extends above at least a portion of the drain. The third gate region can extend across the channel and between the source and the drain. The integrated circuit device can include a trench region. The trench region contains a trench dielectric. The trench region extends from the substrate surface and around the well. The trench region forms a portion of a boundary of the well. The first conductivity type can be n-type. The second conductivity type can be p-type. The gate dielectric can be formed from a single, continuous layer of dielectric material that extends between the substrate surface and the first gate region, the second gate region, and the third gate region. The third gate region can include a first dopant of the first conductivity type. The first gate region and the second gate region can include a second dopant of the second conductivity type. A concentration of the first dopant within the third gate region can be at least 110% of a concentration of the second dopant within the first gate region and within the second gate region.

In a second embodiment, there is provided an integrated circuit device. The integrated circuit device includes a semiconductor substrate. The semiconductor substrate has a substrate surface. The integrated circuit device includes a first well of a first conductivity type. The first well extends from the substrate surface. The integrated circuit device includes a (first) source of a second conductivity type. The second conductivity type is different from the first conductivity type. The (first) source is formed within the first well and extends from the substrate surface. The integrated circuit device can include a second source of the second conductivity type. The second source can be formed within the first well and can extend from the substrate surface. The integrated circuit device includes a second well of the second conductivity type. The second well is formed within the first well and extends from the substrate surface. The second well forms a drain drift region. The second well can extend between the (first) source and the second source. The integrated circuit device includes a (first) channel. The (first) channel is formed within the first well. The (first) channel extends along the substrate surface. The (first) channel electrically separates the (first) source and the second well. The integrated circuit device can include a second channel. The second channel can be formed within the first well and extend along the substrate surface. The second channel can electrically separate the second source and the second well. The integrated circuit device includes a drain of the second conductivity type. The drain extends from the substrate surface and extends within the second well. The integrated circuit device includes a (first) conductive gate. The (first) conductive gate extends across the substrate surface and along the (first) channel between the (first) source and the second well. The (first) conductive gate includes a first gate region of the second conductivity type, a second gate region of the second conductivity type, and a third gate region of the first conductivity type. The third gate region extends between the first gate region and the second gate region. The integrated circuit device includes a (first) silicide region. The (first) silicide region is in electrical communication with the first gate region, the second gate region, and the third gate region. The integrated circuit device can include a second conductive gate. The second conductive gate can extend across the substrate surface and along the second channel between the second source and the second well. The second conductive gate can include a fourth gate region of the second conductivity type, a fifth gate region of the second conductivity type, and a sixth gate region of the first conductivity type. The sixth gate region can extend between the fourth gate region and the fifth gate region. The integrated circuit device can include a second silicide region. The second silicide region can be in electrical communication with the fourth gate region, the fifth gate region, and the sixth gate region. The integrated circuit device includes a gate dielectric. The gate dielectric extends between the substrate surface and the (first) conductive gate and can extend between the substrate surface and the second conductive gate. The gate dielectric electrically isolates the substrate surface from the (first) conductive gate and can electrically isolate the substrate surface from the second conductive gate. The first conductivity type can be n-type. The second conductivity type can be p-type. The integrated circuit device can include a (first) trench region. The (first) trench region contains a trench dielectric. The (first) trench region extends from the substrate surface within the second well. The (first) trench region extends between the drain and the first channel. The integrated circuit device can include a second trench region. The second trench region contains the trench dielectric. The second trench region extends from the substrate surface within the second well. The second trench region extends between the drain and the second channel. The first gate region, the second gate region, the third gate region, and the (first) silicide region can be formed from a (first) polycrystalline silicon body. The third gate region can be in direct electrical contact with the first gate region and the second gate region. The first gate region, the second gate region, and the third gate region can extend between the first silicide region and the gate dielectric. The fourth gate region, the fifth gate region, the sixth gate region, and the second silicide region can be formed from a second polycrystalline silicon body. The sixth gate region can be in direct electrical contact with the fourth gate region and the fifth gate region. The fourth gate region, the fifth gate region, and the sixth gate region can extend between the second silicide region and the gate dielectric. The first gate region can form a first source-proximal edge of the (first) conductive gate. The first source-proximal edge extends above at least a portion of the (first) source. The second gate region can form a drain drift region-proximal edge of the (first) conductive gate. The drain drift region-proximal edge of the (first) conductive gate extends above at least a first portion of the second well. The third gate region can extend across the (first) channel and between the (first) source and the second well. The fourth gate region can form a second source-proximal edge of the second conductive gate. The second source-proximal edge can extend above at least a portion of the second source. The fifth gate region can form a drain drift region-proximal edge of the second conductive gate. The drain drift region-proximal edge of the second conductive gate extends above at least a second portion of the second well. The sixth gate region can extend across the second channel and between the second source and the second well. The third gate region or the sixth gate region can include a first dopant of the first conductivity type. The first gate region, the second gate region, the fourth gate region, or the fifth gate region can include a second dopant of the second conductivity type. A concentration of the first dopant within the third gate region or within the sixth gate region can be at least 110% of a concentration of the second dopant within the first gate region, within the second gate region, within the fourth gate region, or within the fifth gate region.

In a third embodiment, there is provided a method of manufacturing an integrated circuit device. The method includes providing a semiconductor substrate. The semiconductor substrate has a substrate surface. The semiconductor substrate includes a well of a first conductivity type. The well extends from the substrate surface. The semiconductor substrate includes a gate material. The gate material extends across the substrate surface. The semiconductor substrate includes a gate dielectric. The gate dielectric extends between and electrically isolates the gate material and the substrate surface. The method includes forming a conductive gate. The conductive gate extends above the well. The conductive gate includes a first gate region of a second conductivity type that is different from the first conductivity type. The conductive gate includes a second gate region of the second conductivity type. The conductive gate includes a third gate region of the first conductivity type. The third gate region extends between the first gate region and the second gate region. The method includes forming a source of the second conductivity type within the well. The source extends from the substrate surface and adjacent the first gate region. The method includes forming a drain of the second conductivity type within the well. The drain extends from the substrate surface and adjacent the second gate region. The forming the source can include forming the source such that the first gate region extends above at least a portion of the source. The forming the drain can include forming the drain such that the second gate region extends above at least a portion of the drain. The third gate region can extend along a channel. The channel extends between the source and the drain. The method can include forming a silicide region. The silicide region is in electrical communication with the first gate region, the second gate region, and the third gate region. The forming the conductive gate can include doping a central portion of a polycrystalline silicon body with a first dopant of the first conductivity type at a first dopant concentration to form the third gate region. The forming the conductive gate can include doping the polycrystalline silicon body with a second dopant of the second conductivity type at a second dopant concentration to form the first gate region and the third gate region. The second dopant concentration can be less than the first dopant concentration. The providing the semiconductor substrate can include forming the gate dielectric from a single, continuous layer of dielectric material that extends from the substrate surface.

What is claimed is:

1. An integrated circuit device, comprising:
   a semiconductor substrate having a substrate surface;
   a well of a first conductivity type extending from the substrate surface;
   a source of a second conductivity type, which is different from the first conductivity type, formed within the well and extending from the substrate surface;
   a drain of the second conductivity type formed within the well and extending from the substrate surface;
   a channel formed within the well, the channel extending along the substrate surface and electrically separating the source and the drain;
   a conductive gate extending across the substrate surface and along the channel between the source and the drain and comprising
   (i) a first gate region of the second conductivity type, wherein the first gate region comprises a second dopant of the second conductivity type,
   (ii) a second gate region of the second conductivity type, wherein the second gate region comprises the second dopant of the second conductivity type, and
   (iii) a third gate region of the first conductivity type, wherein the third gate region extends between the first gate region and the second gate region, wherein the third gate region comprises a first dopant of the first conductivity type, and further wherein a concentration of the first dopant within the third gate region is at least 110% of a concentration of the second dopant within the first gate region and within the second gate region;
   a gate dielectric extending between and electrically isolating the conductive gate and the substrate surface; and
   a silicide region in electrical communication with the first gate region, the second gate region, and the third gate region.

2. The device of claim 1, wherein the first gate region, the second gate region, the third gate region, and the silicide region are formed from a polycrystalline silicon body.

3. The device of claim 1, wherein the first gate region, the second gate region, and the third gate region extend between the silicide region and the gate dielectric.

4. The device of claim 1, wherein the third gate region is in direct electrical contact with the first gate region and with the second gate region.

5. The device of claim 1, wherein the first gate region forms a source-proximal edge of the conductive gate that extends above at least a portion of the source, wherein the second gate region forms a drain-proximal edge of the conductive gate that extends above at least a portion of the drain, and further wherein the third gate region extends across the channel and between the source and the drain.

6. The device of claim 1, wherein a trench region containing a trench dielectric extends from the substrate surface and around the well to form a portion of a boundary of the well.

7. The device of claim 1, wherein the first conductivity type is n-type and the second conductivity type is p-type.

8. The device of claim 1, wherein the gate dielectric is formed from a single, continuous layer of dielectric material that extends between the substrate surface and the first gate region, the second gate region, and the third gate region.

* * * * *